United States Patent [19]

Terwilliger

[11] 4,319,200
[45] Mar. 9, 1982

[54] MULTI-PASSBAND DIFFERENTIALLY CONTROLLED DATA RATE SYNCHRONIZER

[75] Inventor: Curtis G. Terwilliger, Burlingame, Calif.

[73] Assignee: Cromemco Inc., Mt. View, Calif.

[21] Appl. No.: 118,555

[22] Filed: Feb. 4, 1980

[51] Int. Cl.³ .............................................. H03L 7/08
[52] U.S. Cl. ........................................ 331/8; 331/17; 331/25; 331/34
[58] Field of Search .................. 331/8, 16, 17, 25, 34; 375/120; 455/260; 328/155; 360/51

[56] References Cited

U.S. PATENT DOCUMENTS

| | | |
|---|---|---|
| 3,719,896 | 3/1973 | Holistein, Jr. et al. ............ 331/25 X |
| 4,156,855 | 5/1979 | Crowley ............................ 331/17 X |
| 4,246,545 | 1/1981 | Reisfeld ............................. 331/17 X |

*Primary Examiner*—Siegfried H. Grimm
*Attorney, Agent, or Firm*—Paul Hentzel

[57] ABSTRACT

A phase detector generates an error signal by comparing an input data rate F:in with an output clock rate F:out. The error signal is amplified and applied to the base of an emitter follower circuit. Current from a discharging capacitor within a clock ramp generator flows through the emitter follower and the emitter impedance. The ramp current is controlled by the error signal. The ramp rate F:out is determined by the peak to peak ramp voltage and by the rate of discharge of the ramp capacitor. Variations in the error signal due to F:in drift, cause a compensating change in F:out for continuously maintaining sync between F:in and F:out within each passband. Multi-passband capability is provided by a multi-level current generator which also supplies current through the emitter impedance. The ramp current is reduced to a lower level by an amount equal to the current from the multi-level current source due to the emitter follower action. The ramp period is prolonged by the lower discharge ramp current placing the operation of the synchronizer in a lower passband. Each current level from the multi-level source establishes a separate passband of operation.

21 Claims, 8 Drawing Figures

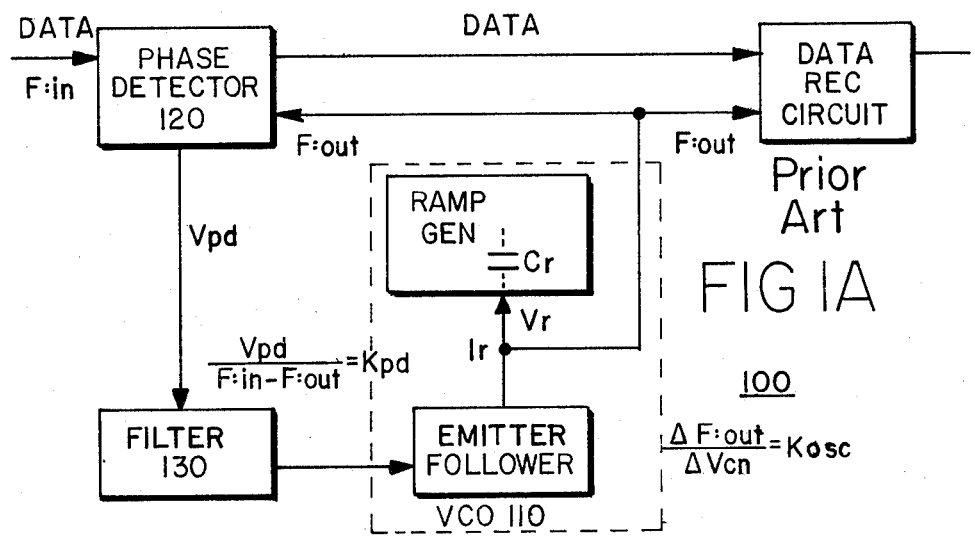
FIG 1A
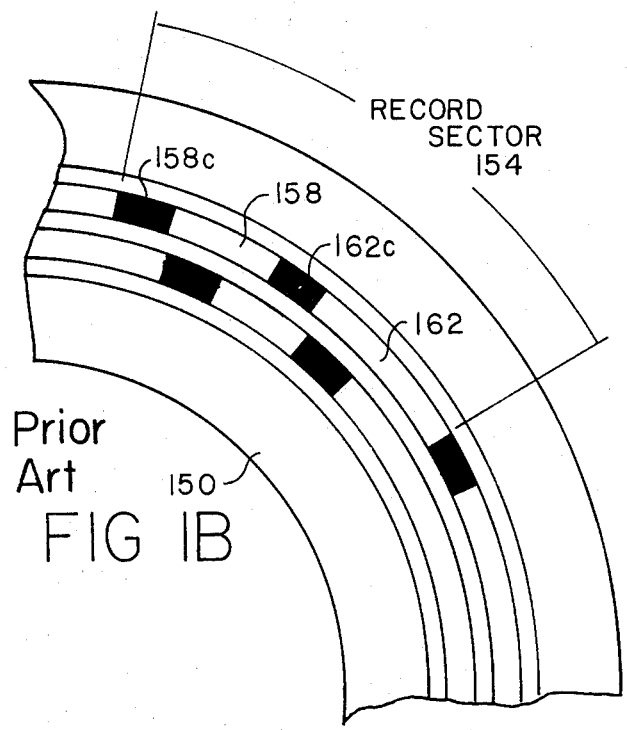
FIG 1B
FIG 1C
FIG 1D

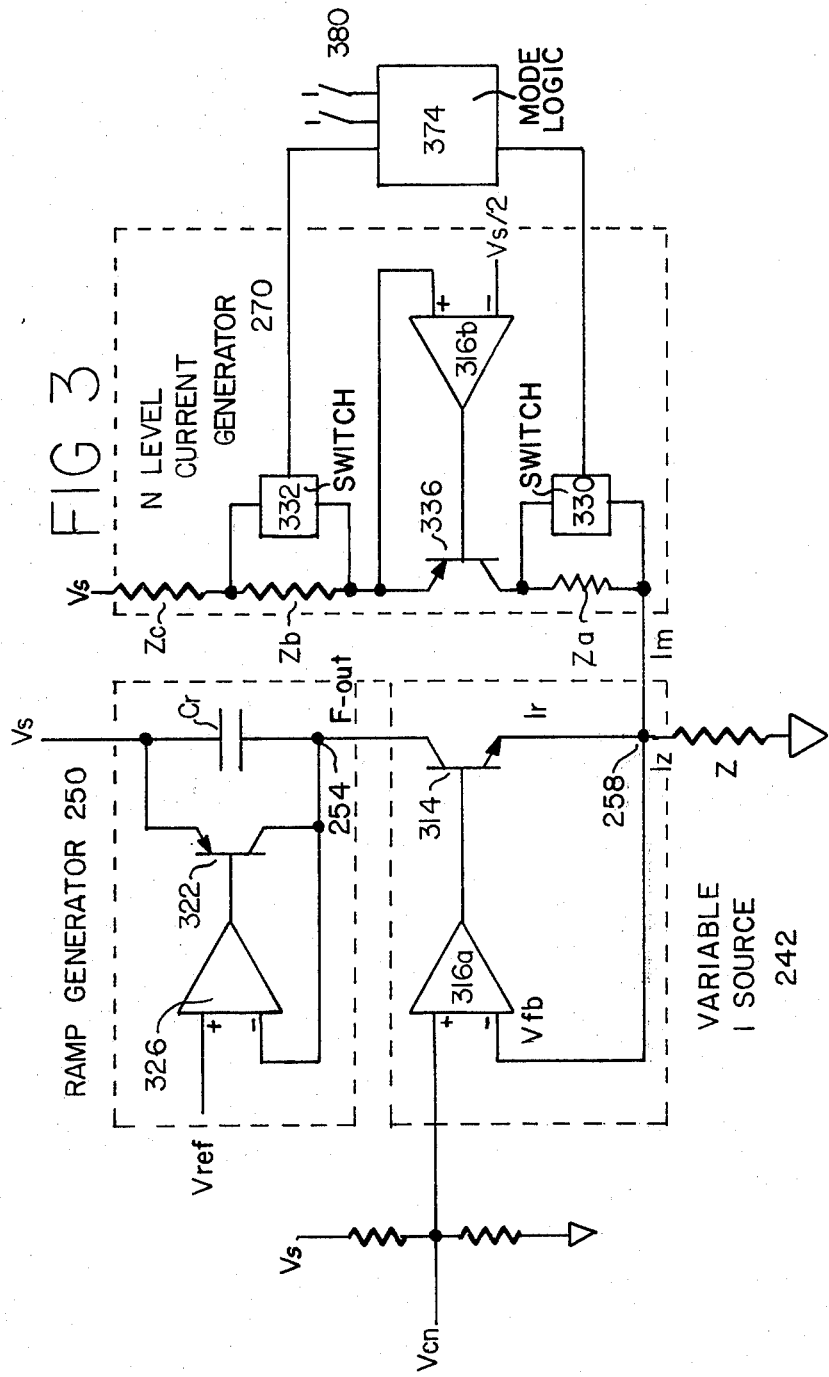

MULTI-PASSBAND DIFFERENTIALLY CONTROLLED DATA RATE SYNCHRONIZER

TECHNICAL FIELD

This invention relates to a data rate synchronizer having a phase-locked loop capable of synchronizing on any data frequency within a plurality of predetermined passbands, and more particularly to such a synchronizer which maintains the same transient response regardless of the passband of operation.

BACKGROUND

Heretofore, single passband synchronizers 100 (see FIG. 1A) have employed voltage controlled oscillators (VCO) 110 in conjunction with phase detectors 120 and filters 130 to form a phase locked loop (PLL). The output clock F:out is synchronized with the input data rate F:in within the passband for providing clock pulses to the data stream from memory. Floppy disc 150 (see FIG. 1B) has a series of concentric circular recording tracks divided into record sectors 154. Each record sector 154 includes an identification word 158 (32 bits) followed by a data word 162 (128 bits). Each data word 162 may have a recording density and subsequent data rate F:in slightly different from the recording density of the associated identification word 158 (due primarily to variations in drive speed between the data systems employed for recording, or the drive speed variations within a single system at different times). Data rate synchronizer 100 must independently resynchronize to the data rate of each new word 158 and 162.

An acquisition code 158c and 162c is provided just before each identification word 158 and data word 162 for permitting synchronizer 100 to adjust to each new data rate prior to actually receiving the bits thereof. Each acquisition code is recorded with a predetermined sequence of "1"s and "0"s at the same time as the subsequent word, and therefore necessarily at the same data density as the subsequent word. The acquisition code length defines the acquisition period within which the PLL of synchronizer 100 must adjust to the small variations inherent in each new F:in.

The PLL frequency response parameters, loop frequency Ff and damping factor Df, are determined primarily by filter 130. The response must be optimized, fast enough to track the new data rate within the associated loop acquisition period, but not so fast as to ring extensively or oscillate.

The conventional passband center frequencies are 125,000 Hz for single density 5 inch discs, 250,000 Hz for double density 5 inch discs and single density 8 inch discs, and 500,000 Hz for double density 8 inch discs. Previous attempts to obtain multiband operation compatible with all of these conventional passbands have involved modifying the circuit components of the prior art VCO 110. These attempts have had limited success because the circuit components responsible for the operational frequency F:out also affect the loop response parameters; and therefore create a different loop response time and damping factor for each passband.

The interdependence of the VCO circuit and PLL are illustrated below for the two basic types of loop filters 130 shown in FIG. 1C and 1D.

| PASSIVE FILTER | ACTIVE FILTER |
|---|---|
| $Lf = \left(\dfrac{K_{osc}K_{pd}}{T1 + T2}\right)^{\frac{1}{2}}$ | $Lf = \left(\dfrac{K_{osc}K_{pd}}{T1}\right)^{\frac{1}{2}}$ |
| $Df =$ | $Df =$ |
| $\dfrac{1}{2}\left(\dfrac{K_{osc}K_{pd}}{T1 + T2}\right)^{\frac{1}{2}}(T2 + 1/K_{osc}K_{pd})$ | $\dfrac{T2}{2}\left(\dfrac{K_{osc}K_{pd}}{T1}\right)^{\frac{1}{2}}$ | where
- Lf is the loop frequency of PLL,
- Df is the damping factor PLL,
- T1 and T2 are the response times of filter 130 ("PHASELOCK TECHNIQUES" p 7–9 by Gardner, Wiley)
- Kpd is the sensitivity of phase detector 120,
- Kosc is the sensitivity of VCO 110, and
- Kosc = dF:out/dVcn = K/CrVr Adjusting the operational frequency F:out by altering the VCO circuit parameters generates a corresponding change in the loop acquisition time.

SUMMARY

It is therefore an object of this invention to provide an improved multi-band data rate synchronizer.

It is another object of this invention to provide a data rate synchronizer capable of tracking at any frequency within a plurality of separate passbands.

It is a further object of this invention to provide a multi-passband data rate synchronizer in which the loop response parameters are optimized for each passband.

It is a further object of this invention to provide a data rate synchronizer having a constant loop acquisition time regardless of the passband of operation.

It is a further object of this invention to provide a data rate synchronizer having a constant loop damping factor regardless of the passband of operation.

BRIEF DESCRIPTION OF THE DRAWING

Further objects and advantages of the present synchronizer and the operation of the differential control, will become apparent from the following detailed description taken in conjunction with the drawing in which:

FIG. 1A is a schematic diagram of a single passband prior art voltage controlled oscillator (VCO);

FIG. 1B is a fragmentary view of a magnetic disc memory showing the recording segments and the acquisition test tracks therein;

FIG. 1C is a schematic diagram of a passive type filter for phase-locked loops;

FIG. 1D is a schematic diagram of an active type filter for phase-locked loops;

FIG. 3 is a schematic diagram of a specific embodiment of a DVCO; and

DETAILED DESCRIPTION

Figure 2A:
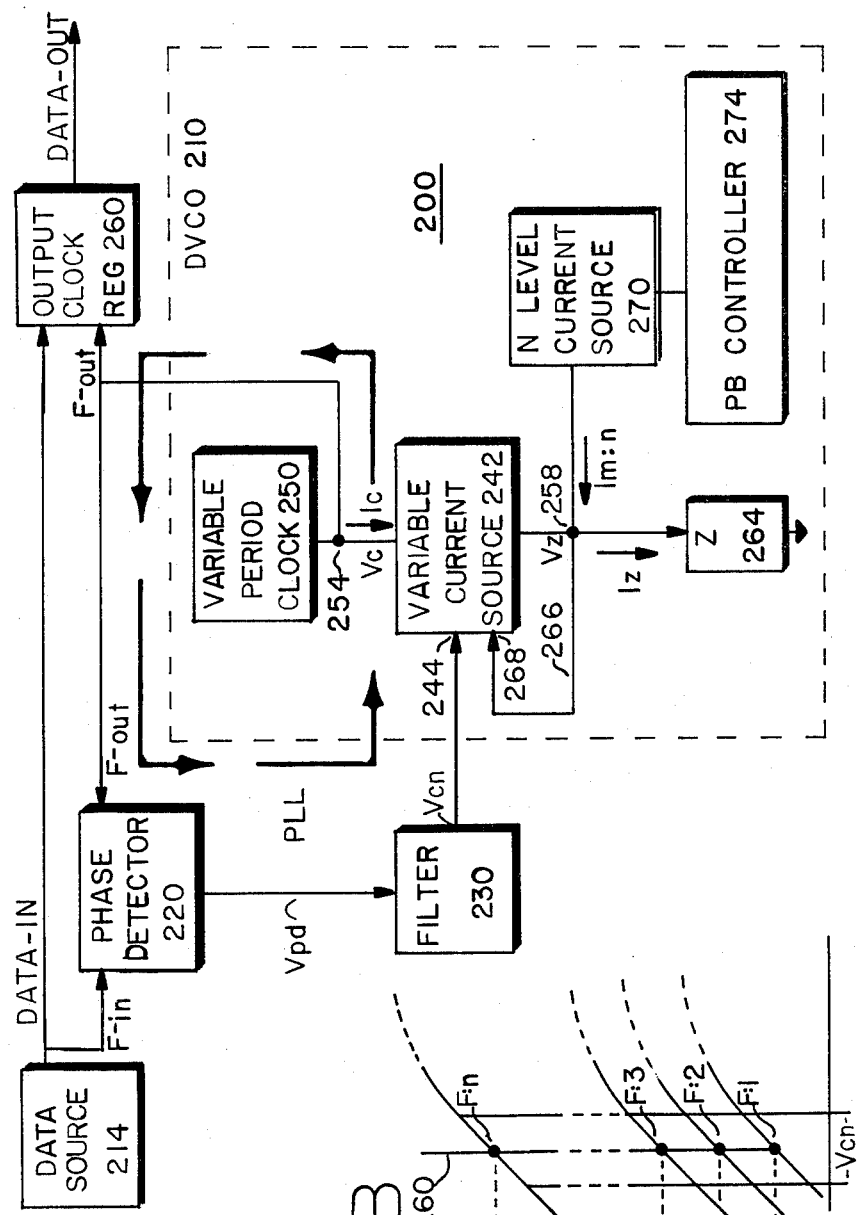
FIG. 2A is a block diagram of a multi-passband, differential voltage controlled oscillator (DVCO) having optimized response parameters at each passband of operation.

Multi-passband synchronizer 200 (see FIG. 2) employs differential voltage controlled oscillator (DVCO) 210 within the PLL for establishing N separate frequency passbands each having a center frequency F:n, an upper frequency limit "u" and a lower frequency limit "lw": F:1(u:1 to lw:1), F:2(u:2 to lw:2), . . . F:N(u:n to lw:n). Data source 214 is typically a motion drive type memory device such as a magnetic disc which inherently provides data at a slightly irregular flow rate F:in. The frequency deviation within a given recorded word is small and varies as a continuous function. F:in deviation from word to word may be larger and discontinuous. Phase detector 220 continuously compares the incremental drift in F:in with F:out from DVCO 210, and generates an error signal Vpd having an instantaneous value proportional to the incremental difference between F:in and F:out. Vpd is passed through filter 230 to form the control voltage Vcn to DVCO 210. Filter 230 may be any suitable loop filter device for establishing the desired loop frequency Fl and damping factor Df within the PLL such as shown in FIG. 1C and 1D. Vcn is applied to a variable current source 242 at control port 244 for controlling clock current (Ic) from variable period clock generator 250. Ic flows through variable current generator 242 from F:out node 254 to feedback node 258.

Figure 2B:
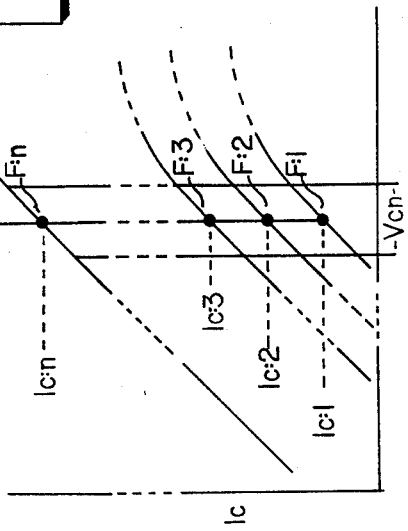
FIG. 2B is a voltage-current characteristic curve for the variable current source of FIG. 2A showing N passbands and N center frequencies.

Variable current source 242 has a family of voltage-current characteristic curves shown in FIG. 2B, one corresponding to each of the N passbands. The dc bias level 260 of variable current source 242 defines a center frequency quiescent point for each passband mode. The Vcn transients modulates the quiescent point of the selected passband along a linear portion of the characteristic curve thereof.

The period of clock signal Vc is inversely proportional to Ic causing F:out to change in response to Vcn. As F:in varies, F:out is adjusted a corresponding amount maintaining clock register 260 in sync with the data flow rate F:in from data source 244.

Ic passes through impedance device 264 developing voltage Vz at feedback node 258, which is returned to variable current source 242 via feedback loop 266 and feedback port 268 for regulation of Vz against Vcn on top of the dc bias level 260. The current Iz through impedance device 254 therefore varies as a function of the quiescent point voltage. In addition, Iz is equal to Ic plus the mode current Im:n from N level current source 270. The operating passband of DVCO 210 is selected through PB controller 274 from the N passbands by establishing one of the N current levels Im:n from current source 270. Each level change in Im produces a corresponding level change in clock current Ic (Ic=Iz−Im:n) establishing quiescent point operation along a different characteristic curve at a different center frequency F:n as depicted in FIG. 2B.

Thus, the N operating passbands of synchronizer 200 are established by the N characteristic curves as controlled by the N current levels of generator 270; and the incremental changes in operating frequency F:out within the established passband are determined by Vcn variations along a particular characteristic curve in response to drift in the data rate frequency F:in.

The loop response parameters, Lf, Df, and acquisition time, remain constant regardless of the selected passband because the circuit elements of DVCO 210 are unchanged. Only the level of Ic changes between passbands.

SPECIFIC EMBODIMENT

The following specific example (see FIG. 3) is given for illustration only. The embodiment shown is not intended to define the limitations of the invention. Numerous other applications are possible involving different configurations and components.

In this specific embodiment, N=3 with three center operating frequencies (F:1=500 KHz, F:2=250 KHz, F:3=125 KHz) and three mode currents Im:n. Df is maintained at the critical value, and Lf is equal to the inverse of the acquisition time specified for data source 214. The clock signal has a periodic ramp voltage waveform Vc, but a constant Ic (except for variations caused by Vcn drift). Variable current source 242 is formed by a transistor 314 (2N3904) with input operational amplifier 316 (one half of a CA3240) for receiving feedback voltage variations Vfb from feedback node 258. Operational amplifier 316a combines Vcn and a 0.6 dc bias voltage (at the positive input) with Vfb (at the negative input) for driving the base of transistor 314 until Vfb=Vcn. The emitter p-n junction loss of transistor 314 is re-established by the comparison capability of operational amplifier 316a causing the voltage Vz across Z (1.00K ohms) to exactly follow Vcn. Preferably, each passband is plus or minus about 10% of the center frequency F to accommodate the drift range of F:n.

Ramp generator 250 is formed by capacitor Cr (400 picofarads) which discharges during the reset portion of each clock cycle when ramp switching transistor 322 (2N3640) is on. At the start of the ramp portion of each clock cycle, Cr is discharged. Cr charges through transistor 314 causing the decreasing voltage at 254 to approach reference voltage Vref (3.8 volts dc). Comparator 326 (TL810) combines Vref (at the positive input) and the ramp voltage (at the negative input) to form the base current to ramp transistor 322. The ramp portion is terminated and the reset portion initiated when the base current increases above the cut-off value. Ramp switching transistor 322 then conducts briefly permitting Cr to discharge.

Current source 270 (N=3) is formed by a three element resistor string which provides three separate modes or current levels (Im:1, Im:2, and Im:3). During mode one, switch 330 (one quarter of a 4066) is open in response to mode logic 374 (Im:1=0, R:1=Za=infinity, Ir:1=600 microamps, and F:1=500,000 Hz). Mode logic establishes mode 2 by opening switch 332 (one quarter of a 4066) and closing switch 330 (Im:2=300 microamps, R:2=Zb+Zc=8.49K ohms, Ir:2=300 microamps, and F:2=250,000 Hz). Mode logic 374 establishes mode 3 by closing both switches 330 and 332 (Im:3=450 microamps, R:3=Zc=2.87K ohms, Ir:3=150 microamps, and F:3=125,000 Hz). Transistor 336 (2N3906) and inverter 316b (the other half of a CA3240) form an emitter follower circuit for regulating Im against Vs/2. This regulation isolates Im from thermal transients and Vfb at feedback node 254. Mode logic 374 maybe a software controlled two bit circuit, or merely a pair of panel switches 380.

Figure 4:
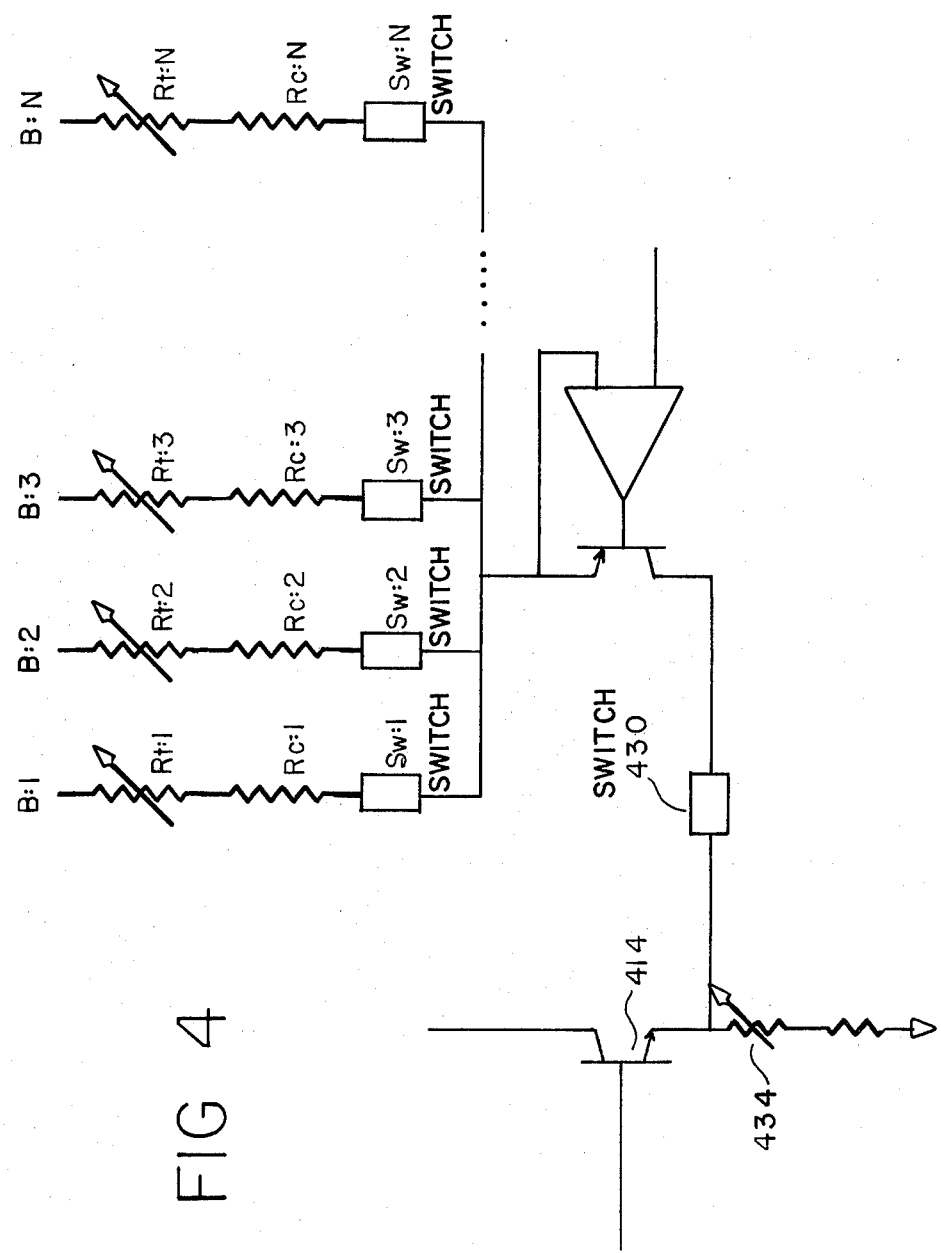
FIG. 4 is a block diagram of a modified N level current generator having parallel branches.

The N level current source may have a plurality of parallel branches B:1–B:n (see FIG. 4) for providing the passband current levels. Each branch has a current determining resistor Rc in series with a mode switch Sw. If desired, each branch may have a trimmer resistance Rt in series with Rc for initial calibration (or occasional adjustment) of the current Im:n of that branch. Rt offers a fine adjustment of the quiescent frequency or center frequency F:n of each mode, in order to compensate for component variation and aging. If a series switch 430 is provided to establish the Im=0 mode, then a corresponding trimmer resistance 434 may be provided in the emitter circuit of transistor 414 for calibrating Ic.

CONCLUSION

The objects of this invention have been achieved by providing mode current Im:n through the emitter branch in addition to the variable Ic. Each Im establishes the center frequency of a passband to provide multi-passband operation. The added Im:n does not affect the sensitivity (Kosc) of the VCO, and therefore the PLL response parameters remain constant. The resulting constant response time and damping factor permit the synchronizer to lock onto each F:in variation within the specified acquisition time of the data source.

It will be apparent to those skilled in the art that changes and modifications may be made in the embodiments shown without departing from the scope of the invention. For example, the synchronizer may be employed with other types of variable rate data sources besides floppy discs.

Therefore, the scope of the invention is to be determined by the terminology of the following claims and the legal equivalent thereof.

I claim as my invention:

1. A data flow rate synchronizer which receives data-in at a varying flow rate F:in within a selected one of N flow rate passbands for providing a variable period clock signal F:out which maintains synchronization with F:in, comprising:
   phase detector means for comparing F:out with F:in, and providing an error signal in response thereto;
   variable current means for providing a current Ic which varies in response to the error signal;
   a variable period clock generator responsive to Ic for providing a clock signal F:out having a period which varies in a compensatory direction with respect to the variations in F:in for maintaining synchronization therewith within the selected passband;
   N level current source means for providing a current Im at one of the N current levels;
   passband controller for establishing the selected passband by controlling the current level Im provided by the N level current source;
   summing means for combining Ic with Im;
   feedback means responsive to the summing means for causing the sum of Ic and Im to track the error signal for accommodating variations in the data flow rate F:in, and for causing a level change in Ic proportional and opposite to each level change in Im for changing the clock period to establish the passband corresponding to the change in Im.

2. The synchronizer of claim 1, wherein the phase detector means and the variable current means and the variable period clock generator form a phase-locked loop between F:in and F:out.

3. The synchronizer of claim 2, wherein the phase-locked loop further comprises a filter means between the phase detector means and the variable current means for controlling the response time and damping factor of the phase-locked loop.

4. The synchronizer of claim 3, wherein the response time and the damping factor of the phase-locked loop have substantially the same value for each of the N passbands.

5. The synchronizer of claim 4, wherein the variable current means has a voltage-current quiescent point of operation which varies in response to the error signal for controlling Ic.

6. The synchronizer of claim 5, wherein the quiescent point variations cause a generally linear variation in Ic.

7. The synchronizer of claim 6, wherein the voltage aspect of the quiescent point is the same for the N passbands, and the current aspect of the quiescent point changes as a function of Im.

8. The synchronizer of claim 7, wherein the N level current source is a network of impedance means and switching means.

9. The synchronizer of claim 8, wherein the N level current source further comprises a current regulator means for maintaining the established Im at a constant level.

10. The synchronizer of claim 9, wherein the current regulator means comprises:
    an input stage responsive to variations in Im; and
    a current control stage connected in negative feedback relationship with the input stage for controlling Im.

11. The synchronizer of claim 10, wherein:
    the input stage is an operational amplifier for regulating the selected current against a reference voltage, and
    the current control stage is a transistor.

12. The synchronizer of claim 8, wherein the network of impedance means and switching means within the N level current source is formed by N impedance means and N-1 switching means.

13. The synchronizer of claim 12, wherein one of the N-1 switching means is connected in series with the remainder of the network, for providing an impedance of infinity when open and Im=0.

14. The synchronizer of claim 13, wherein N=3.

15. The synchronizer of claim 8, wherein the network of switching means and impedance means comprises a plurality of parallel branches each formed by an impedance means and a switching means connected in series.

16. The synchronizer of claim 8, wherein the variable period clock generator is a ramp generator for providing a ramp voltage waveform for F:out.

17. The synchronizer of claim 16, wherein the ramp voltage waveform has a ramp duty portion and a reset duty portion, and the ramp voltage waveform is defined by an upper limit voltage and a lower limit voltage.

18. The synchronizer of claim 16, wherein the period of the ramp waveform is inversely proportional to the ramp current Ic.

19. The synchronizer of claim 18, wherein the ramp generator further comprises:
    capacitor means which provides the ramp voltage waveform by charging and discharging;
    comparator means for comparing one of the limit voltages of the ramp voltage waveform to a reference potential; and
    switching means responsive to the comparator means for initiating the reset duty portion.

20. The synchronizer of claim 19, wherein the capacitor charges through the variable current means during the ramp duty portion, and discharges during the reset duty portion of each period.

21. The synchronizer of claim 20, wherein Ic has a constant quiescent value subject to variations in response the error signal.

* * * * *